United States Patent
Tsutsui et al.

(10) Patent No.: US 7,346,318 B2
(45) Date of Patent: Mar. 18, 2008

(54) HIGH FREQUENCY POWER AMPLIFIER COMPONENT AND RADIO COMMUNICATION SYSTEM

(75) Inventors: Takayuki Tsutsui, Saku (JP); Hiroyuki Nagamori, Komoro (JP); Kouichi Matsushita, Karuizawa (JP)

(73) Assignees: Renesas Technology Corp., Tokyo (JP); Hitachi Hybrid Network Co., Ltd., Yokohama, Kanagawa (JP)

( * ) Notice: Subject to any disclaimer, the term of this patent is extended or adjusted under 35 U.S.C. 154(b) by 599 days.

(21) Appl. No.: 10/844,423

(22) Filed: May 13, 2004

(65) Prior Publication Data

US 2004/0229579 A1    Nov. 18, 2004

(30) Foreign Application Priority Data

May 15, 2003    (JP)    ............................. 2003-136767

(51) Int. Cl.
H04B 1/04    (2006.01)
(52) U.S. Cl. .................... 455/127.4; 330/269; 330/130; 455/93
(58) Field of Classification Search ................ 455/102, 455/93, 127.1, 127.4; 330/261, 269, 273, 330/285, 296, 123, 130
See application file for complete search history.

(56) References Cited

U.S. PATENT DOCUMENTS

| | | | |
|---|---|---|---|
| 6,351,189 B1 * | 2/2002 | Hirvilampi | 330/296 |
| 6,636,114 B2 * | 10/2003 | Tsutsui et al. | 330/51 |
| 6,756,850 B2 * | 6/2004 | Matsushita et al. | 330/285 |
| 6,885,246 B2 * | 4/2005 | Tsutsui et al. | 330/285 |
| 6,958,649 B2 * | 10/2005 | Nagamori et al. | 330/133 |
| 6,967,535 B2 * | 11/2005 | Matsushita et al. | 330/285 |
| 7,053,708 B2 * | 5/2006 | Nagamori et al. | 330/133 |
| 7,078,974 B2 * | 7/2006 | Matsushita et al. | 330/285 |
| 7,116,173 B2 * | 10/2006 | Tsutsui et al. | 330/285 |
| 7,123,094 B2 * | 10/2006 | Tahara et al. | 330/285 |
| 7,123,095 B2 * | 10/2006 | Tsutsui et al. | 330/285 |
| 7,193,471 B2 * | 3/2007 | Tsutsui et al. | 330/285 |

(Continued)

FOREIGN PATENT DOCUMENTS

| | | |
|---|---|---|
| JP | 2000-151310 | 8/1999 |
| JP | 2002-094331 | 9/2000 |

*Primary Examiner*—Edward F. Urban
*Assistant Examiner*—Christian A. Hannon
(74) *Attorney, Agent, or Firm*—Reed Smith LLP; Stanley P. Fisher, Esq.; Juan Carlos A. Marquez, Esq.

(57) ABSTRACT

In radio communication system that is able to transmit in two or more modulation modes, e.g., one modulation mode when phase shifts are performed and another modulation mode when phase shifts and amplitude shifts are performed, the disclosed invention can avoid that receiving band noise becomes so great not to conform to the GSM standards' prescription for such noise in a high voltage region of the power supply voltage, even when the output power is controlled by changing the amplitude of the input signal to the power amplifier circuitry while fixing the bias voltages to be applied to the power amplifying transistors. When the output power is controlled as above, in the modulation mode (GSM mode) when phase shifts are performed, idle currents flowing across the power amplifying transistors are regulated, depending on the power supply voltage, i.e., the idle currents are decreased when the power supply voltage is high and increased when the power supply voltage is low.

2 Claims, 8 Drawing Sheets

U.S. PATENT DOCUMENTS

| | | | |
|---|---|---|---|
| 2002/0030541 A1* | 3/2002 | Tsutsui et al. | 330/133 |
| 2003/0001676 A1* | 1/2003 | Matsushita et al. | 330/285 |
| 2003/0155972 A1* | 8/2003 | Ngo et al. | 330/133 |
| 2003/0160654 A1* | 8/2003 | Fischer et al. | 330/129 |
| 2003/0184382 A1* | 10/2003 | Tsutsui et al. | 330/285 |
| 2004/0090267 A1* | 5/2004 | Nagamori et al. | 330/133 |
| 2004/0164808 A1* | 8/2004 | Matsushita et al. | 330/310 |
| 2004/0212434 A1* | 10/2004 | Nagamori et al. | 330/285 |
| 2004/0263254 A1* | 12/2004 | Tahara et al. | 330/285 |
| 2005/0156672 A1* | 7/2005 | Matsushita et al. | 330/310 |
| 2005/0168281 A1* | 8/2005 | Nagamori et al. | 330/133 |
| 2005/0179498 A1* | 8/2005 | Tsutsui et al. | 330/285 |
| 2005/0218989 A1* | 10/2005 | Tsutsui et al. | 330/285 |
| 2005/0280471 A1* | 12/2005 | Matsushita et al. | 330/289 |
| 2006/0006944 A1* | 1/2006 | Matsushita et al. | 330/285 |
| 2006/0192616 A1* | 8/2006 | Takahashi et al. | 330/141 |
| 2006/0279359 A1* | 12/2006 | Tsutsui et al. | 330/285 |
| 2007/0008037 A1* | 1/2007 | Tsutsui et al. | 330/285 |
| 2007/0030073 A1* | 2/2007 | Tahara et al. | 330/285 |

* cited by examiner

HIGH FREQUENCY POWER AMPLIFIER COMPONENT AND RADIO COMMUNICATION SYSTEM

CROSS-REFERENCE TO RELATED APPLICATION

The present application claims priority from Japanese patent application JP 2003-136767 filed on Mar. 15, 2003, the content of which is hereby incorporated by reference into this application.

BACKGROUND OF THE INVENTION

The present invention relates to a technique that is effective for application to high-frequency power amplifier circuitry which is used to amplify and output high-frequency transmission signals in radio communication system such as mobile phones and an electronic component into which the amplifier circuitry is integrated. More particularly, the invention relates to a technique that is effective for use in high-frequency power amplifier circuitry which is used in mobile phones capable of communication in different modes and different frequency bands, adaptive to a plurality of communication schemes, and an electronic component (power module) into which the amplifier circuitry is integrated.

One of cellular telephone systems, conventionally used for radio communication equipment (mobile communication equipment) such as mobile phones, is a system called Global System for Mobile Communication (GSM) which is used in Europe. This GSM system uses a phase modulation method that is called Gaussian Minimum Shift Keying (GMSK) in which carrier phase shifts encode information to be communicated.

In general, high-frequency power amplifier circuitry is built into the transmitter output section of radio communications equipment. Conventional GSM-compliant radio communications equipment has an arrangement in which the bias voltages to be applied to the high-frequency power amplifier circuitry are controlled to provide an output power required for voice transmission by a control voltage that is output from an "Automatic Power Control (APC)" circuit which generates a transmitting output control signal, based on a signal from a detector to detect a transmitting output and a transmission power level required from a baseband LSI (Patent Document 1). In this arrangement, the amplitude of a signal input to the high-frequency power amplifier circuitry is kept constant.

Meanwhile, a new scheme, Enhanced Data Rates for GSM Evolution (EDGE), has been proposed for use in recent mobile phones. In this scheme, a mobile phone has dual mode communication functions, that is, voice signals are modulated by GMSK when voice communication is performed and data signals are modulated by 8-PSK (Phase Shift Keying) when data communication is performed. The 8-PSK modulates carriers in such a manner that an amplitude shift is added to a phase shift of the carriers modulated by GMSK. The GMSK modulated carrier transmits one bit of information per symbol, whereas the 8-PSK modulated carrier is able to transmit three bits of information per symbol. This, the EDGE scheme enables communication at a higher transmission rate than the GSM scheme.

In communication systems based on the GSM scheme, it is simply required to amplify and output phase-shifted signals according to a required output power level and, therefore, the high-frequency power amplifier circuitry is allowed to operate even in a saturated region of voltage. However, in radio communication systems that enable data transmission and reception according to the EDGE scheme, it is necessary to perform amplitude control and, therefore, the high-frequency power amplifier circuitry is required to perform linear operation in a non-saturated region of voltage.

A method for driving the high-frequency power amplifier circuitry in communication system that can accommodate both the GSM and EDGE schemes has been proposed (Patent Document 2). According to this method, in a GSM mode when GMSK modulation is performed, the amplitude of an input signal to the amplifier circuitry is fixed and bias circuits control the gate bias voltages to be applied to output power FETs. In an EDGE mode when 8-PSK modulation is performed, the gate bias voltages to be applied to the output power FETs are fixed and the output power is controlled by changing the amplitude of the input signal.

[Patent Document 1]
Japanese Unexamined Patent Publication No. 2000-151310

[Patent Document 2]
Japanese Unexamined Patent Publication No. 2002-94331

SUMMARY OF THE INVENTION

A disadvantage associated with the method disclosed in Patent Document 2 which controls the output power by changing the amplitude of the input signal while fixing the gate bias voltages to be applied to the output power FETs in the EDGE mode is that a variable gain amplifier to change the input signal amplitude in the EDGE mode and a circuit for controlling the variable gain amplifier are needed, which enlarges the circuitry scale. Also, this method has a drawback that a complex control circuit must be formed because the variable gain amplifier and the bias voltages to be applied to the high-frequency power amplifier circuitry must be controlled simultaneously to enhance the modulation accuracy and power addition efficiency during a low output.

In the method disclosed in Patent Document 2 which controls the output power by changing the amplitude of the input signal while fixing the gate bias voltages to be applied to the output power FETs in the EDGE mode, the high-frequency power amplifier circuitry is required to perform linear operation to prevent the distortion of an output signal during the EDGE mode. In view hereof, to obtain a good linear characteristic, the bias voltages to be applied to the output power FETs must be set to produce a higher gain than in the GSM mode and cause much idle current to flow. However, that results in an excessively high gain when the input signal level is low and, consequently, a noise component is also amplified. This causes a problem of increase of signal leakage to a receiving frequency band which is at least about 20 MHz separated from a transmitting frequency (receiving band noise).

The present inventors made an examination of the method for controlling the output power by changing the amplitude of the input signal while fixing the gate bias voltages to be applied to the output power FETs in the GSM mode when GMSK modulation is performed as well as in the EDGE mode when 8-PSK modulation is performed.

As a result, it was found that a problem as will be discussed below was presented. Most of current mobile phones use a rechargeable lithium-ion battery as the power supply. The lithium-ion battery supplies a relatively high voltage as 4.7 V immediately after it is charged, but the power level gradually drops as the mobile phone is used and down to as quite a low voltage as 2.9 V when the battery has been consumed to a level of minimum necessary power it provides. The inventors observed a relationship between the output power Pout of a transmitting mobile phone and the level of receiving band noise through actual measurements and obtained the results as shown in FIGS. 7(A) and 7(B) and FIGS. 8(A) and 8(B).

FIG. 7(A) shows a relationship between the output power Pout and the level of receiving band noise when the mobile phone transmits in the GSM mode. FIG. 7(B) shows a relationship between the gain of the high-frequency power amplifier circuitry and the level of receiving band noise when the mobile phone transmits in the GSM mode. FIG. 8(A) shows a relationship between the output power Pout and the level of receiving band noise when the mobile phone transmits in the EDGE mode. FIG. 8(B) shows a relationship between the gain of the high-frequency power amplifier circuitry and the level of receiving band noise when the mobile phone transmits in the EDGE mode. The measurements were carried out with the transmission signal frequency set at 915 MHz, the center frequency of the receiving band set at 935 MHz, and the resolution bandwidth of the receiving band set to 100 kHz.

Each graph of FIGS. 7(A), 7(B), 8(A), and 8(B) plots three characteristic curves representing the relationships between the output power Pout or gain and the receiving band noise level in three cases: a chain line curve corresponds to the relationship for the case where the battery supplies a relatively high voltage as 4.7 V immediately after it is charged; a broke line curve corresponds to the relationship for the case where the battery has been consumed and the voltage dropped to quite a low voltage as 2.9 V, almost when recharging is needed (so-called battery rundown); a solid line curve corresponds to the relationship for the case where the battery voltage falls between the voltage immediately after the battery is charged and the voltage immediately before it is recharged.

By the GSM standards, it is prescribed that the receiving band noise introduced by the output power Pout of the high-frequency power amplifier circuitry shall be −83 dBm and below. In general, it is very desirable that the gain of the high-frequency power amplifier circuitry is at least 33 dB to eliminate the need to increase the output of VCO in front of the amplifier circuitry. While no problem in EDGE mode transmission is found from FIGS. 8(A) and 8(B), it is seen from FIGS. 7(A) and 7(B) that the receiving band noise characteristic in GSM mode transmission when the battery voltage is 4.7 V immediately after being charged does not conform to the above prescription of the GSM standards when the output power rises to 21 dB and above and when the gain rises to 35.5 dB and above (as indicated by the chain line curves in FIG. 7).

A conceivable solution to this problem is to decrease the bias voltages to be applied to the output power amplifiers so that the receiving band noise characteristic conforms to the above prescription when the battery voltage is 4.7 V immediately after being charged. However, to do this results in that sufficient output power cannot be obtained when the battery has been consumed and its voltage dropped to 2.9 V and below, becoming so low that it must be recharged, because the output power Pout of the output power amplifiers drops accordingly. Consequently, a minimum voltage to ensure the mobile phone operation must be set higher and, thus, earlier recharging is required. This causes a disadvantage that the maximum aggregate call time and idle time that the mobile phone can operate after the battery is fully charged becomes shorter.

It is an object of this invention to make it possible to constrain the receiving band noise from being so great that such noise characteristic does not conform to the GSM standards' prescription for such noise in a high voltage region of power supply voltage, even when the output power is controlled by changing the amplitude of the input signal to the power amplifier circuitry while fixing the bias voltages to be applied to power amplifying transistors in radio communication system that is able to transmit in two or more modulation modes.

It is another object of this invention to make it possible to lengthen the maximum aggregate call time and idle time that the mobile phone can operate after the battery is fully charged in radio communication system such as mobile phones that are able to transmit in two or more modulation modes.

The above and other objects and novel features of the present invention will be apparent from the description of the present specification and the accompanying drawings.

A typical aspect of the invention disclosed herein can be summarized as follows.

In radio communication system that is able to transmit in two or more modulation modes, e.g., one modulation mode (GSM mode) when phase shifts are performed and another modulation mode (EDGE mode) when phase shifts and amplitude shifts are performed, its output power is controlled by changing the amplitude of the input signal to the amplifier circuitry while fixing the bias voltages to be applied to the power amplifying transistors in whichever mode, and, in the modulation mode when phase shifts are performed, idle currents flowing across the power amplifying transistors are regulated, depending on the power supply voltage, i.e., the idle currents are decreased when the power supply voltage is high and increased when the power supply voltage is low.

By means described above, in the modulation mode when phase shifts are performed, because the idle currents flowing through the power amplifying transistors decrease when the power supply voltage is high, the receiving band noise can be prevented from being so great that such noise characteristic does not conform to the GSM standards' prescription for such noise in a high voltage region of the power supply voltage. Because the idle currents flowing through the power amplifying transistors increase when the power supply voltage is low, insufficient power can be avoided in a low voltage region of the power supply voltage.

DETAILED DESCRIPTION OF THE PREFERRED EMBODIMENTS

Preferred embodiments of the present invention will be described hereinafter, based on the accompanying drawings.

Figure 1:
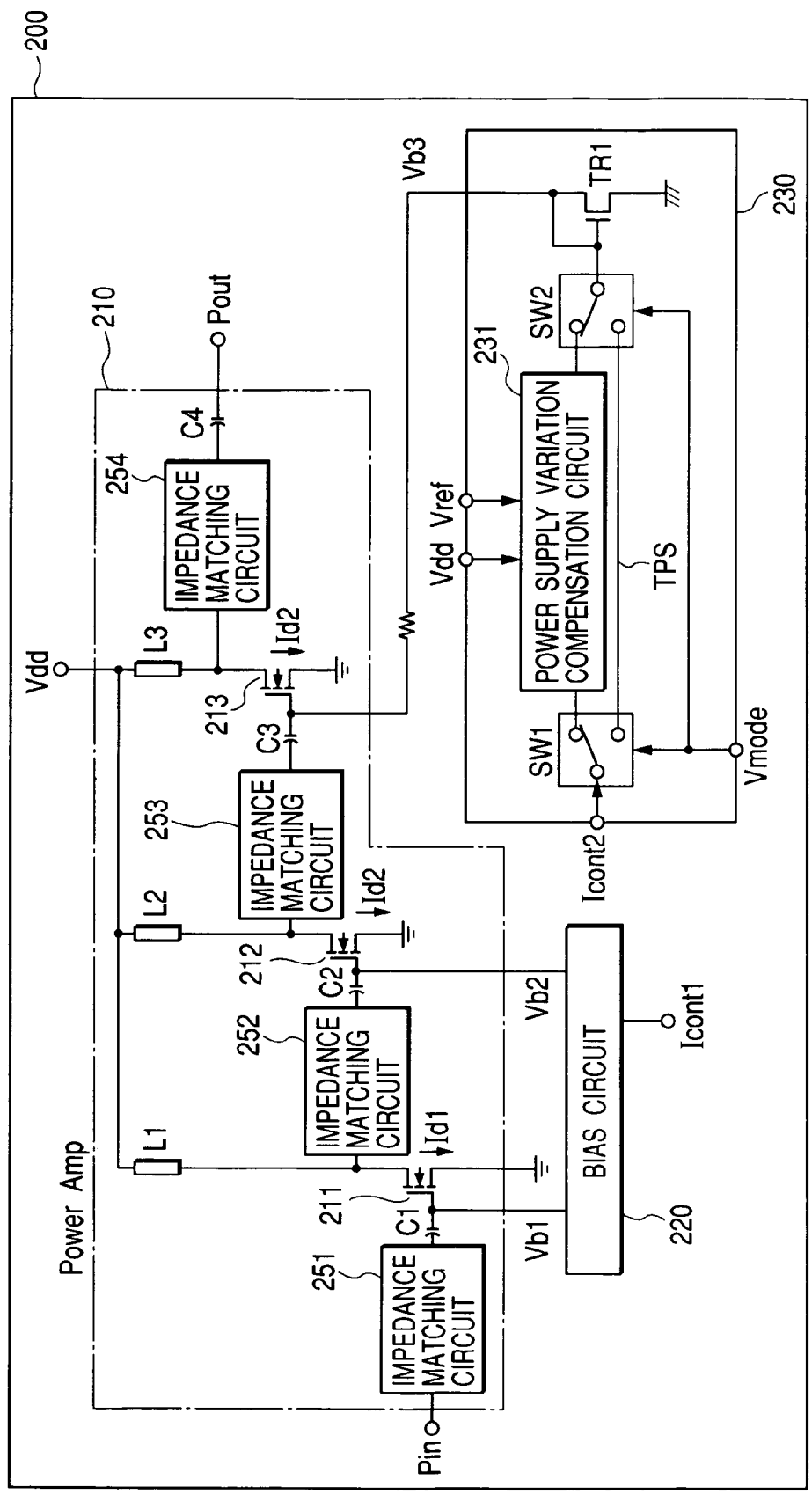
FIG. 1 is a circuit diagram showing an embodiment of high-frequency power amplifier circuitry (a power module) to which the present invention is applied.

FIG. 1 shows an embodiment of high-frequency power amplifier circuitry (a power module 200) to which the present invention is applied. In the present specification, a circuit board fabricated so as to be treated as one electronic component is referred to as a module, wherein a plurality of semiconductor chips and discrete components are installed on an insulative substrate such as a ceramic substrate with printed wirings on its surface and inside it and the components are connected by the printed wirings and wire bondings to perform certain functions.

The power module 200 of this embodiment consists of a high-frequency power amplification block 210 comprising power amplifying FETs which amplify high-frequency signals Pin input to the power module and bias circuits 220 and 230 which apply bias voltages to the power amplifying FETs in each stage and controls idle currents Id1, Id2, Id3 flowing through the FETs 211, 212, 213.

The high-frequency power amplification block 210 of this embodiment is comprised of three power amplifying FETs 211, 212, 213, wherein the gate terminal of the second FET 212 is connected to the drain terminal of the first FET 211 and the gate terminal of the third FET 213 is connected to the drain terminal of the second FET 212, thus being configured as a three-stage amplifier circuit as a whole. However, the constitution of the amplification block is not so limited.

To the drain terminals of the FETs 211, 212, 213 in each stage constituting the high-frequency power amplification block 210, power supply voltage Vdd is applied via inductance elements L1, L2, L3, respectively. Between the gate terminal of the first FET 211 and the input terminal In, an impedance matching circuit 251 and a DC-cutoff capacitance element C1 are installed and the high-frequency signals Pin are input via these circuit and element to the gate terminal of the FET 211.

Between the drain terminal of the first-stage FET 211 and the gate terminal of the second-stage FET 212, an impedance matching circuit 252 and a DC-cutoff capacitance element C2 are connected. Between the drain terminal of the second-stage FET 212 and the gate terminal of the last-stage FET 213, an impedance matching circuit 253 and a DC-cutoff capacitance element C3 are connected. The drain terminal of the last-stage FET 213 is connected via an impedance matching circuit 254 and a DC-cutoff capacitance element C4 to the output terminal OUT and the high-frequency input signals Pin are output as signals Pout in which DC components have been cut off and AC components amplified.

In this embodiment, gate bias voltages Vb1, Vb2 supplied from the bias circuit 220 are applied to the gate terminals of the first-stage and second-stage FETs 211, 212 and gate bias voltage Vb3 supplied from the bias circuit 230 is applied to the gate terminal of the third-stage FET 213, so that the idle currents Id1, Id2, Id3 depending on these bias voltages flow through the FETs 211, 212, 213, respectively.

The bias circuit 220 receives control current Icont1 supplied from an RF control IC including a baseband circuit outside the circuitry of FIG. 1 and supplies the gate bias voltages Vb1, Vb2 to the first-stage and second-stage FETs 211, 212. The bias circuit 230 receives control current Icont2 supplied from the same base band IC and supplies the gate bias voltage Vb3 to the third-stage FETs 213.

The bias circuit 230 includes a transistor TR1 with its drain terminal connected via a resistor R0 to the gate terminal of the third-stage FET 213. The gate and drain terminals of the transistor TR1 are connected and the third-stage FET 213 and the transistor TR1 form a current mirror circuit which works to allow current that is proportional to the drain current of the transistor TR1 to flow through the third-stage FET 213.

On the other hand, the bias circuit 220 which supplies the gate bias voltages Vb1, Vb2 to the first-stage and second-stage FETs 211, 212 may be formed of transistors which are current mirrors connected with the FETs 211, 212, respectively, and convert the control current Icont1 to voltages, as the transistor TR1 in the bias circuit 230 and the third-stage FET 213 form the current mirror. Alternatively, the bias circuit 220 may consist entirely of a resistance voltage divider circuit which simply converts the control current Icont1 to voltages.

The bias circuit 230 of this embodiment comprises the transistor TR1, current mirror connected with the third-stage FET 213, a power supply variation compensation circuit 231 which receives the control current Icont2 and outputs current depending on the level of power supply voltage Vdd, a through-pass TPS which supplies the control current Icont2 as is to the transistor TR1, a change-over switch SW1 which selectively supplies the control current Icont2 to the power supply variation compensation circuit 231 or the through pass TPS, according to a mode control signal Vmode, and a change-over switch SW2 which selectively supplies the current output from the power supply variation compensation circuit 231 or the control current Icont2 flowing through the through pass TPS to the transistor TR1.

Specifically, when the mode control signal Vmode indicates the EDGE mode in which 8-PSK modulation is performed, the switches SW1 and SW2 make connections to the through pass TPS to supply the control current Icont2 to the transistor TR1. When the mode control signal Vmode indicates the GSM mode in which GMSK modulation is performed, the switches SW1 and SW2 change over the connections to the power supply variation compensation circuit 231 to supply the compensated control current Icont2 to the transistor TR1. The power supply variation compensation circuit 231 watches the power supply voltage Vdd and operates to decrease its output current Ibias to be supplied to the transistor TR1 when the control current Icont2 is large and Vdd is high.

As discussed above, given that the control current Icont2 is set to provide sufficient output power even with a low power supply voltage, e.g., 2.9 V, immediately before battery rundown in the GSM mode, when the power supply voltage rises to 4.7 V immediately after the battery is recharged, while the control current Icont2 is supplied as is to the transistor TR1, the receiving band noise level is likely to exceed the upper limit prescribed by the GSM standards, as the output power Pout exceeds 20 dB. But, by configuring the bias circuit 230 as in the present embodiment and adjusting the control current to decrease the output current Ibias to be supplied to the transistor TR1 when the power supply voltage Vdd is high in the GSM mode, the receiving band noise level can be suppressed to be lower than the upper limit prescribed by the GSM standards.

Given that the control current Icont2 is set so that the receiving band noise level does not exceed the upper limit prescribed by the GSM standards when the power supply voltage is high, e.g., 4.7 V immediately after a battery recharge in the GSM mode, when the battery voltage drops to, e.g., 2.9 V immediately before battery rundown, while the control current Icont2 is supplied as is to the transistor TR1, it is likely to happen that sufficient output power cannot be obtained as the power supply voltage is too low. But, by configuring the bias circuit 230 as in the present embodiment and adjusting the control current to increase the output current Ibias to be supplied to the transistor TR1 when the power supply voltage Vdd is low in the GSM mode, sufficient output power can be obtained even with a low power supply voltage immediately before battery rundown.

In this embodiment, when in the GSM mode, the switches SW1 and SW2 always change over the connections to the power supply variation compensation circuit 231 to supply the compensated control current Icont2 to the transistor TR1. However, the bias circuit 230 may be configured to further include a circuit to judge whether the control current Icont2 is large or small; in this configuration, the switches SW1 and SW2 are actuated to change over the connections to the power supply variation compensation circuit 231 only if the control current Icont2 is large when in the GSM mode.

Figure 2:
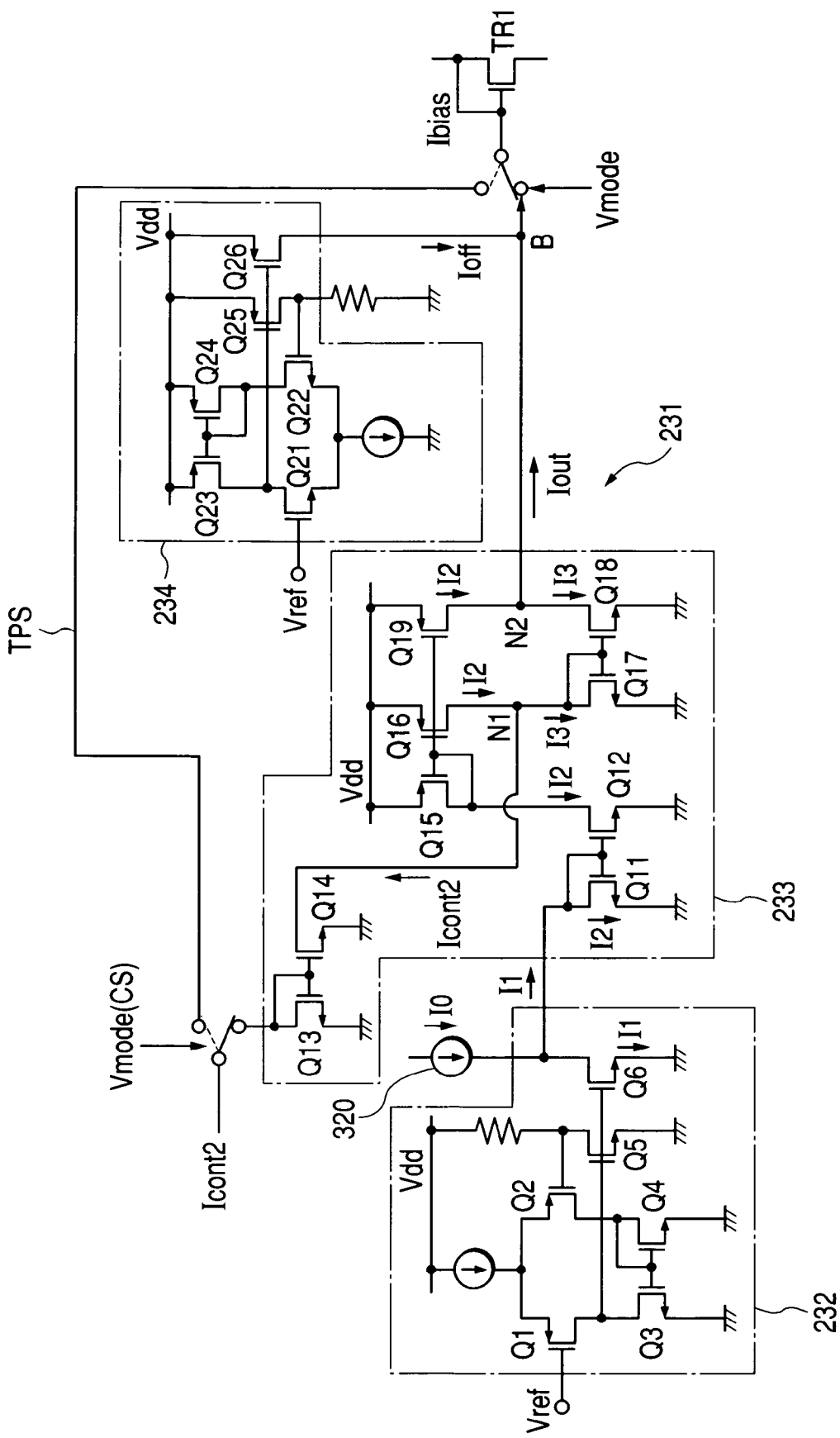
FIG. 2 is a circuit diagram showing a circuit configuration example of a power supply variation compensation circuit.

FIG. 2 shows a circuit configuration example of the power supply variation compensation circuit 231.

The power supply variation compensation circuit 231 of this embodiment is formed of a voltage-current conversion circuit 232 which generates reference current I2 that is dependent on the power supply voltage, based on reference voltage Vref and constant current I0, a current combiner circuit 233 which generates current I3 having a desired characteristic, based on the reference current I2 and the control current Icont2, and an offset current adder circuit 234 which gives an offset current to the generated current I3.

In FIG. 2, TPS is the through pass as a bypass to supply the control current Icont2 as is to the transistor TR1. SW1 and SW2 are the change-over switches which operate in accordance with the mode control signal Vmode to supply the control current Icont2 through the through pass TPS to the transistor TR1 in the EDGE mode and supply the Icont2 to the power supply variation compensation circuit 231 and supply the adjusted current to the transistor TR1 in the GSM mode.

The voltage-current conversion circuit 232 comprises a differential amplification stage with a pair of P-channel MOSFETs Q1 and Q2 as input transistors and an output stage having output transistors Q5 and Q6 which are source-follower type N-channel MOSFETs. The reference voltage Vref is applied to the gate terminal of one input transistor Q1 and the drain voltage of the output transistor Q5 is fed back to the gate terminal of the other input transistor Q2 which operates as a voltage follower. The same voltage as applied to the transistor Q5 is applied to the gate terminal of the output transistor Q6 and current I1 that depends on the reference voltage Vref flows across the output transistor Q6.

To the drain terminal of this transistor Q6, a constant current source 320 which generates the constant current I0 is connected and current I2, equal to a difference between the current I0 and the current I1, is output (I0>I1). Here, because the input transistor Q1 to which the reference voltage Vref is applied is a P-channel MOSFET, the voltage-current conversion circuit 232 operates on the basis of the power supply voltage Vdd and voltage which is a potential difference between Vdd and Vref appears at the drain of the transistor Q1.

Figure 3A:
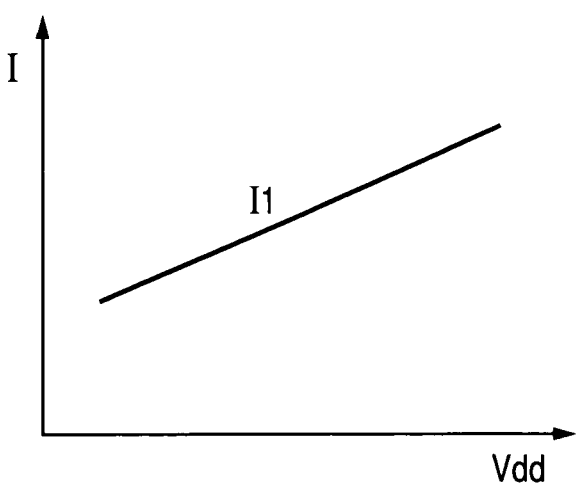
FIGS. 3(A)-3(C) are graphs representing characteristics of currents occurring in the power supply variation compensation circuit of an embodiment.
Figure 3B:
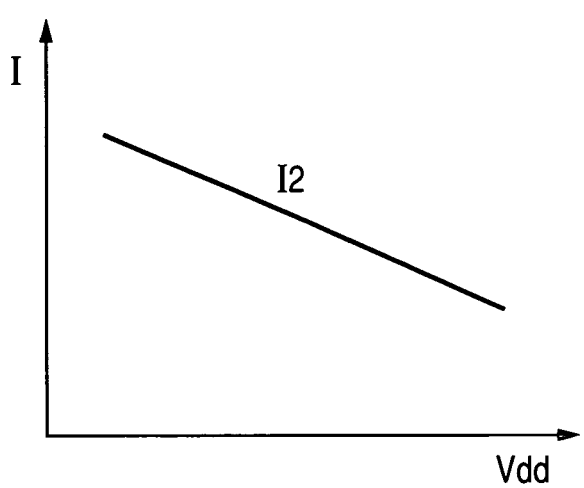

Therefore, when the power supply voltage Vdd changes, the drain voltage of the transistor Q1 changes accordingly and the current I1 flowing across the output transistor Q6 also changes as Vdd changes. In short, the current I1 is dependent on the power supply voltage. If the constant current source 320 that is independent of the power supply voltage is used, the output current I2 which is a difference between the current I0 and the current I1 is also dependent on the power supply voltage. However, the current I1 flowing across the output transistor Q6 exhibits a proportional characteristic of dependency on the power supply voltage, as is shown in FIG. 3(A), whereas the output current I2 exhibits an inversely proportional characteristic of dependency on the power supply voltage, as is shown in FIG. 3(B).

The current combiner circuit 233 is formed of a first current mirror circuit consisting of a MOSFET Q11 across which the output current I2 flows and a MOSFET Q12, the MOSFETs Q11 and Q12 being connected to a common gate, a second current mirror circuit consisting of a MOSFET Q13 across which the control current Icont2 supplied via the switch SW1 flows and a MOSFET Q14, the MOSFETs Q13 and Q14 being connected to a common gate, a third current mirror circuit consisting of a MOSFET Q15 which is connected in series with the mirrored MOSFET Q12 in the first current mirror circuit and across which the same current as the current I2 flows and a MOSFET Q16, the MOSFET Q15 and Q16 being connected to a common gate, a fourth current mirror circuit consisting of a MOSFET Q17 across which current I3 (=I2−Icont2), equal to a difference between the drain current of the Q16 and the drain current of the Q14, flows and a MOSFET Q18, the MOSFETs Q17 and Q18 being connected to a common gate, and a MOSFET Q19 connected in series with the mirrored MOSFET Q18 in the fourth current mirror circuit.

The gate terminal of the MOSFET Q19 is connected to the common gate to which the MOSFET Q15 is connected and the MOSFETs Q19 and Q15 constitute a current mirror circuit. Currents in accordance with a size ratio between the Q15 and Q19 (ratio in terms of gate width if the Q15 and Q19 have the same channel length) flow across the Q15 and Q19. In this embodiment, the size ratio between the Q15 and Q19 is assumed to be "1". The power supply variation compensation circuit 231 of this embodiment outputs current Iout whose characteristic of change differs, depending on the magnitude of the control current Icont2 supplied from the baseband circuit, that is, whether Icont2 is greater or smaller than I2 (=I0−I1).

Specifically, if Icont2 is greater than the maximum value I2max of I2, Icont2>I2max, as is apparent when a node N1 is looked at, the drain current I2 of the MOSFET Q16 is fully drawn to the MOSFET Q14 and, therefore, the current I3 to flow through the MOSFETs Q17 and Q18 becomes "0" and output current Iout(1) from the current combiner circuit 233 become equal to I2. Thus, when Icont2 is greater than the I2max, the output current Iout (1) changes in inverse proportion to the power supply voltage Vdd over the range of the Vdd change, similar to the characteristic of I2 shown in FIG. 3(B), that is, the current decreases as the power supply voltage Vdd increases (see a broken line graph in FIG. 3(C)).

Otherwise, if Icont2 is smaller than the maximum value I2max of I2, Icont2<I2max, as is apparent when the node N1 is looked at, I3=I2−Icont2 up to a level of voltage Vdd1 as long as Icont2 is equal to I2 which changes, depending on the power supply voltage Vdd, Icont2=I2. Now, looking at a node N2, because the current Iout is I2−I3, output current Iout(2) is equal to Icont2 (constant) during the period up to the Vdd1 level. When the power supply voltage Vdd further rises, Icont2 becomes greater than I2, Icont2>I2, and the current I3 becomes "0". Consequently, the current Iout(2) which is output from the current combiner circuit 233 becomes equal to I2. The output current Iout(2) in this case remains constant up to Vdd1 and decreases as I2 does when the power supply voltage increases more than Vdd1, as is denoted by a solid line graph in FIG. 3(C).

Figure 3C:
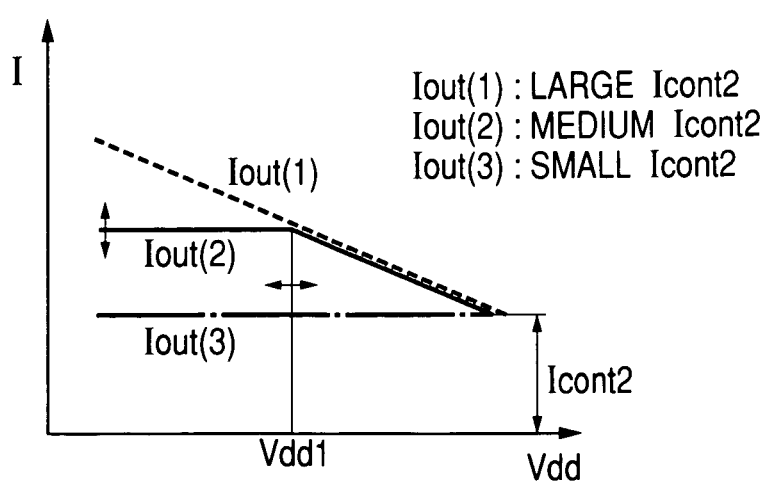

As the control current Icont2 becomes smaller and smaller, the power supply voltage Vdd1 becomes higher, corresponding to a point at which the output bias current Iout(2) starts to decrease, that is, a point that the graph of Iout(2) begins to decline in FIG. 3(C). Eventually, the output bias current Iout(3) becomes constant, equaling Icont2 over the full range of change of the power supply voltage Vdd, as denoted by a chain line graph in FIG. 3(C).

The offset current adder circuit 234 included in the power supply variation compensation circuit 231 of FIG. 2 comprises a differential amplification stage with a pair of N-channel MOSFETs Q21 and Q22 as input transistors and an output stage having output transistors Q25 and Q26 which are source-follower type P-channel MOSFETs. The reference voltage Vref is applied to the gate terminal of one input transistor Q21 and the drain voltage of the output transistor Q25 is fed back to the gate terminal of the other input transistor Q22 which operates as a voltage follower. The same voltage as applied to the transistor Q25 is applied to the gate terminal of the output transistor Q26 and current Ioff that depends on the reference voltage Vref flows across the output transistor Q26.

The drain terminal of this transistor Q26 is connected to the output terminal of the current combiner circuit 233 and the output current Ioff of the offset current adder circuit 234 is added to the output current Iout of the current combiner circuit 233. The resultant current Iout+Ioff is supplied as the bias current Ibias via the switch SW2 to the transistor TR1.

Here, because the input transistor Q21 to which the reference voltage Vref is applied is a N-channel MOSFET, the offset current adder circuit 234 operates on the basis of ground potential and voltage which is a potential difference between Vref and the ground potential appears at the drain of the transistor Q21. Because the ground potential is stable unlike the power supply voltage Vdd, the drain voltage of the transistor Q21 does not change even if the power supply voltage Vdd changes and the current Ioff flowing across the output transistor Q26 is steady, independent of Vdd change.

In short, the current Ioff is independent of the power supply voltage. As a result, the power supply variation compensation circuit 231 of the present embodiment outputs the bias current Ibias whose characteristic aspects correspond to Ioff increments to the output currents Iout(1) to Iout(3) of the current combiner circuit 233, the graphs of these currents being shown in FIG. 3(C). Accordingly, the bias current Ibias exhibits an inversely proportional characteristic of dependency on the power supply voltage Vdd when the control current Icont2 is relatively large.

Figure 4:
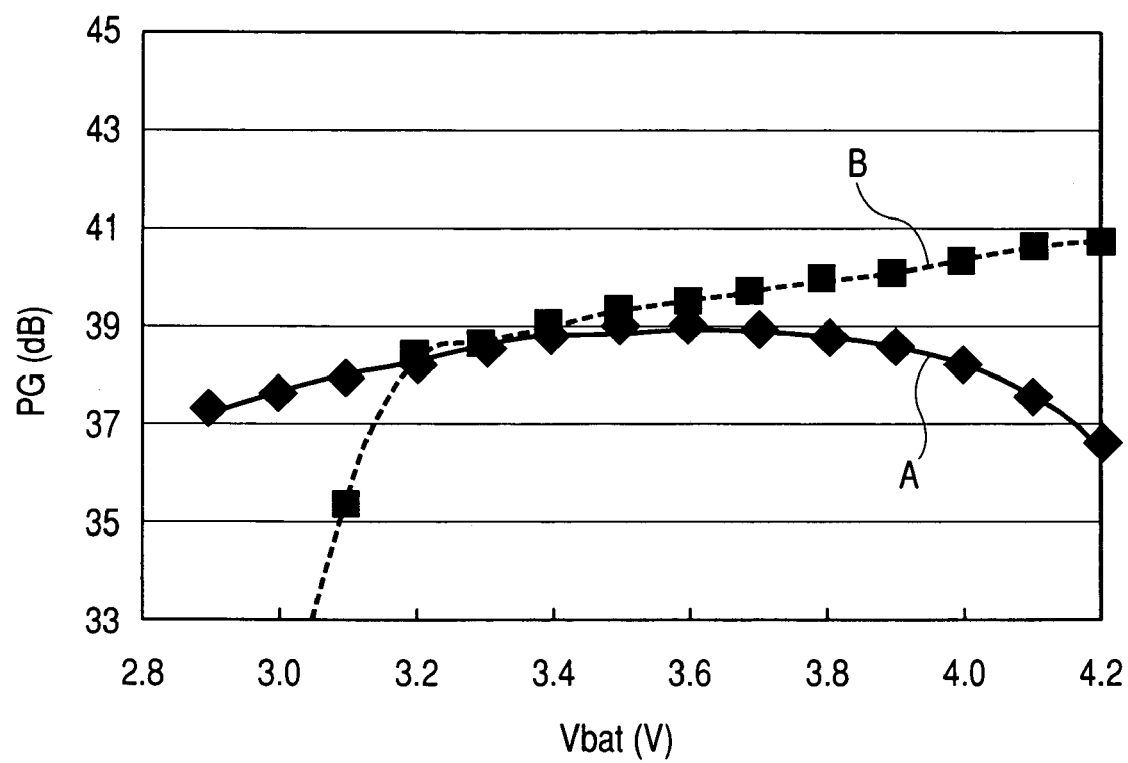
FIG. 4 is a graph showing a relationship between the gain and power supply voltage of the high-frequency power amplifier circuitry where a bias circuit including the power supply variation compensation circuit of the embodiment is applied, in comparison with the corresponding graph of prior-art amplifier circuitry.

If the power module does not include the power supply variation compensation circuit 231, when a constant control current Icont2 is supplied to the power module in the GSM mode, the gain PG of the high-frequency power amplifier circuitry continues to rise as the power supply voltage Vdd rises, as is denoted by a broken line graph B shown in FIG. 4. When the bias circuit including the power supply variation compensation circuit 231 of this embodiment is applied, the gain PG of the high-frequency power amplifier circuitry can be depressed in a high voltage region of the power supply voltage Vdd, as is denoted by a solid line graph A shown in FIG. 4. In consequence, the receiving band noise introduced by the output power Pout in the GSM mode is suppressed to conform to the GSM standards' prescription for this noise. Meanwhile, insufficient power in a low voltage region of the power supply voltage Vdd can be avoided. Furthermore, by setting the constant current Icont2 and offset current Ioff to optimal values in the power supply variation compensation circuit 231, the characteristic of the bias current Ibias depending on the power supply voltage Vdd can be adjusted to be optimum for the power amplifying FET 213.

Figure 5:
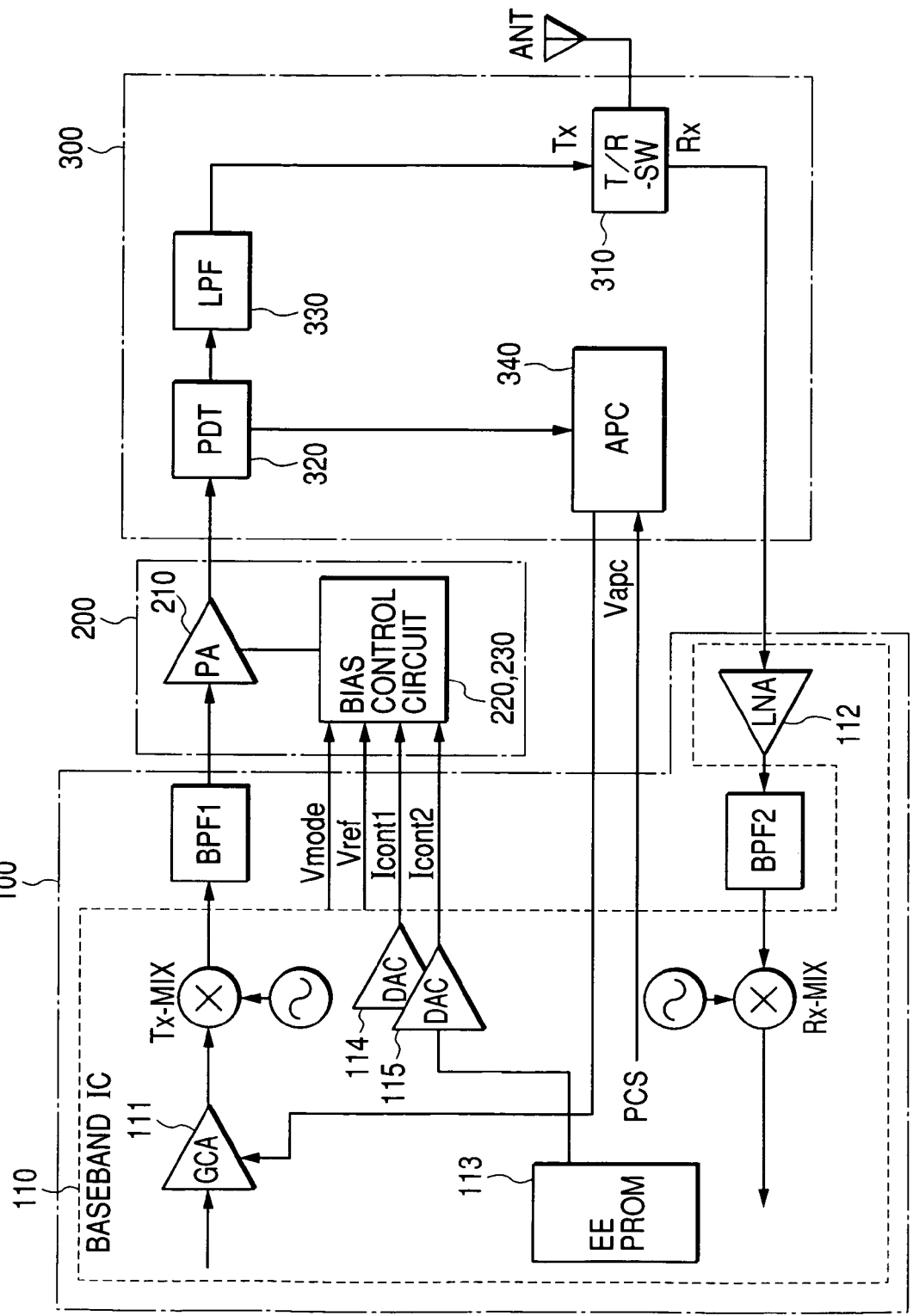
FIG. 5 is a block diagram showing an outlined configuration of a radio communication system capable of radio communication in two modulation modes, GSM and EDGE, as an example of the system to which the present invention is applied.

FIG. 5 shows an outlined configuration of a radio communication system capable of radio communication in two modulation modes, GSM and EDGE, as an example of the system to which the present invention is applied.

The radio communication system of FIG. 5 is made up of a electronic device 100 including a baseband IC 110, the power module 200 of the above-described embodiment in which the high-frequency power amplification circuit (power amp) 210 which amplifies high-frequency signals output from the electronic device 110, the bias control circuits 220 and 230, etc. are installed on a single ceramic substrate, and a front-end module 300 comprising a transmission/reception change-over switch (T/R-SW) 310 and other components. ANT is an antenna for transmitting and receiving signal radio.

The electronic device 100 comprises modulation/demodulation circuits which are capable of GMSK modulation and demodulation and EDGE modulation and demodulation, the baseband IC 110 which separates data to be transmitted (baseband signals) into I and Q signal streams and processes I and Q signals extracted from received RF signals, a band pass filter BPF1 which removes higher harmonic components from transmit signals, a band pass filter BPF2 which removes unwanted waves from received RF signals, and other components installed on a single package (hereinafter, this device will be referred to as an RF device).

The baseband IC 110 of this embodiment comprises, in addition to a baseband circuit to process high-frequency signals, which is not shown, a gain control amplifier (GCA) 111 which amplifies modulated transmit signals, a mixer Tx-MIX which upconverts amplified transmit signals, a low noise amplifier (LNA) 12 which amplifies received RF signals, a mixer Rx-MIX which downconverts amplified received RF signals, and other components formed on a single semiconductor chip.

The baseband IC 110 further includes a nonvolatile memory 113 such as EEPROM to store table data which is referenced when the baseband IC outputs the control currents Icont1 and Icont2 and DA conversion circuits 114, 115 which make digital-to-analog conversion of values of current data read from the memory 113 and output analog currents, but the embodiment is not so limited.

The front-end module 300 comprises, in addition to the TX/RX change-over switch 310, a power detector circuit (PDT) 320 consisting of a coupler and the like to detect the power level of transmit signals output from the power module 200, a filter (LPF) 330 which removes noise such as higher harmonics involved in transmit signals, and an automatic power control (APC) circuit 340 which generates an output power control signal Vapc to be delivered to the gain control amplifier GCA within the baseband IC 110, based on a detected power level signal from the above detector circuit 320 and a power control signal PCS from the baseband IC 110.

As shown in FIG. 5, in the radio communication system of this embodiment, the control currents Icont1, Icont2, and mode control signal Vmode are supplied from the baseband IC 110 in the RF device 100 to the bias circuits 220, 230 in the power module 200. The reference voltage Vref which is input to the voltage-current conversion circuit 232 and the offset current adder circuit 234 in the bias circuit 230 shown in FIG. 2 is also supplied from the baseband IC 110 in the RF device 100.

As shown in FIG. 5, in this embodiment, with the gain of the power amp 210 being kept constant by the control currents Icont1, Icont2 supplied from the baseband IC 110, the output power control signal Vapc is supplied from the automatic power control circuit 340 which controls the output power level to the gain control amplifier 111 in the baseband IC 100 and the gain of the gain control amplifier 111 is controlled by the output power control signal Vapc.

The input power to the power amp 210 is adjusted in this way and the output power of the power amp 210 is controlled to change accordingly. Because the bias circuit 230 which applies bias to the power amp 210 has the power supply variation compensation function as described above, the gain of the power amp 210 can be kept almost constant, while the receiving band noise is suppressed to conform to the GSM standards' prescription for this noise, even when the power supply voltage Vdd changes because of a battery recharge and as the battery power is consumed. In this embodiment, table data, based on which the power control signal PCS is generated and supplied to the automatic power control circuit 340, is created, according to the required output power level supplied from a base station, and stored into the nonvolatile memory 120.

In this embodiment, the band pass filters BPF1, BPF2 consist of capacitance elements and resistance elements which are attached externally to the baseband IC 110. However, the constituent elements of the band pass filters BPF1, BPF2 can be formed integrally with the baseband IC 110 on the same semiconductor chip. While the low noise amplifier 112 is installed within the baseband IC 110 in the embodiment of FIG. 5, the low noise amplifier 112 may be made as an external circuit attached to the baseband IC 110. The system may further include a microprocessor (CPU) that exerts overall control, which is, however, not shown. Specifically, the microprocessor generates control signals to the RF device 100 and generates an output power level directive signal, based on which the power control signal PCS is generated.

The control currents Icont1, Icont2 which are supplied from the baseband IC 110 to the bias circuits 220, 230 will now be discussed.

The baseband IC 110 controls the magnitude of the control currents Icont1, Icont2 stepwise, according to the required output power level supplied from a base station. When generating the control currents Icont1, Icont2, according to the required output power level, the baseband IC refers to the data table stored in the EEPROM 120. More specifically, for the GSM mode (GMSK modulation) use, three levels of control currents Icont1, Icont2 are set for three levels of output power Pout settings, which are listed in Table 1. Assuming that the battery voltage is 3.5 V between 4.7 V immediately after the battery is charged and 2.9 V immediately before the battery is recharged, the control current values listed in Table 1 are set to provide optimum output power.

TABLE 1

| Pout | Icont1 | Icont2 |
| --- | --- | --- |
| 35 dBm | 0.8 mA | 2.0 mA |
| 20 dBm | 0.8 mA | 0.3 mA |
| 5 dBm | 0.8 mA | 0.1 mA |

For the EDGE mode (8-PSK modulation) use, two levels of control currents Icont1, Icont2 are set for two levels of output power Pout settings, which are listed in Table 2. Settings of the control currents are not limited to those listed in Tables 1 and 2 which are only illustrative and should be determined in view of the performance and characteristics of the FETs which are constituent elements of the high-frequency power amplification circuit 210. In the EDGE mode, it may also be preferable for the baseband IC to output only a predetermined value of the control currents Icont1, Icont2 without selecting any of a plurality of preset levels of the control currents. In that case, the data table for the edge mode use can be regarded unnecessary.

TABLE 2

| Pout | Icont1 | Icont2 |
| --- | --- | --- |
| 28 dBm | 0.8 mA | 0.5 mA |
| 10 dBm | 0.8 mA | 0.3 mA |

Figure 6:
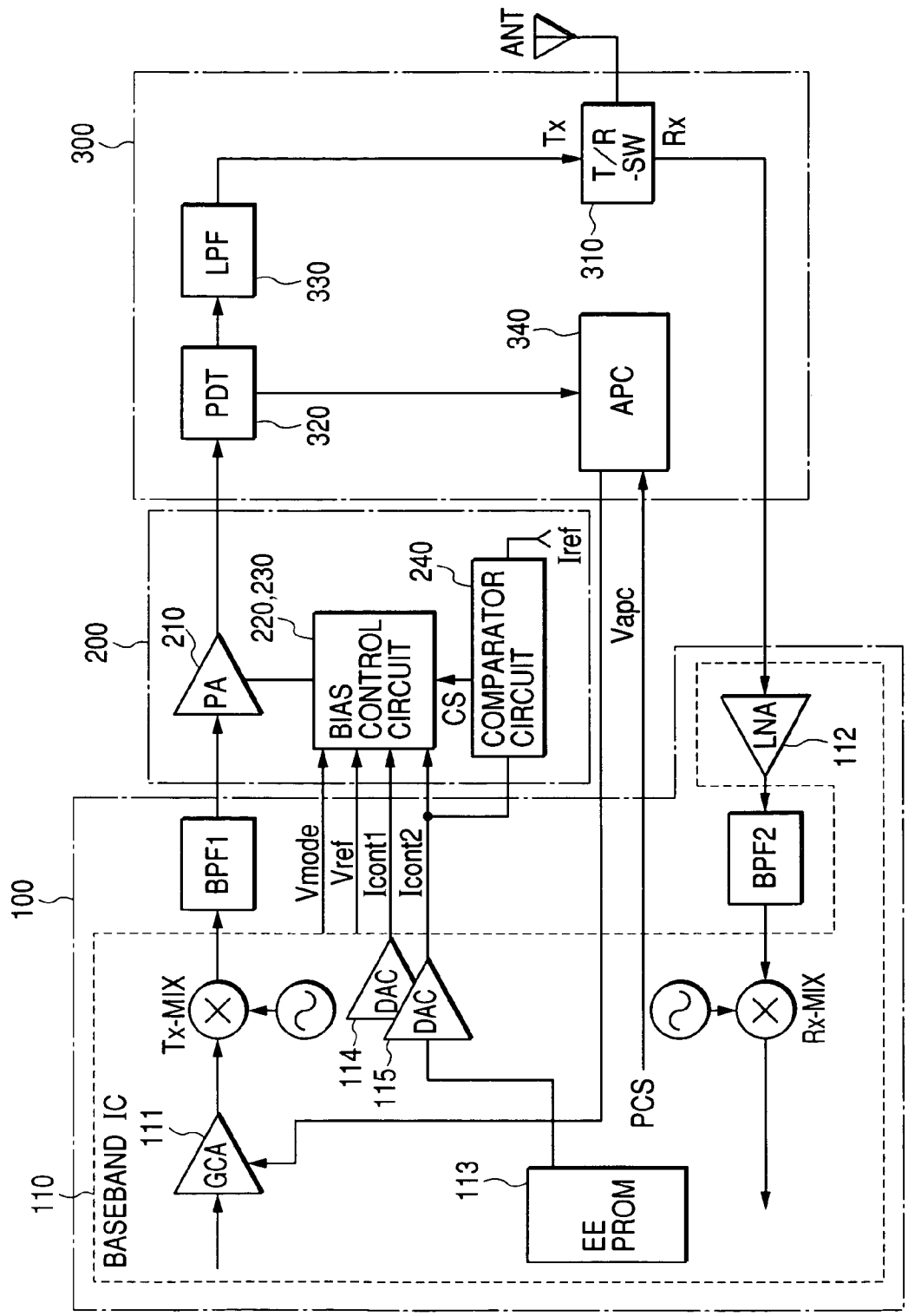
FIG. 6 is a block diagram showing a second embodiment of radio communication system to which the present invention is applied.
Figure 7A:
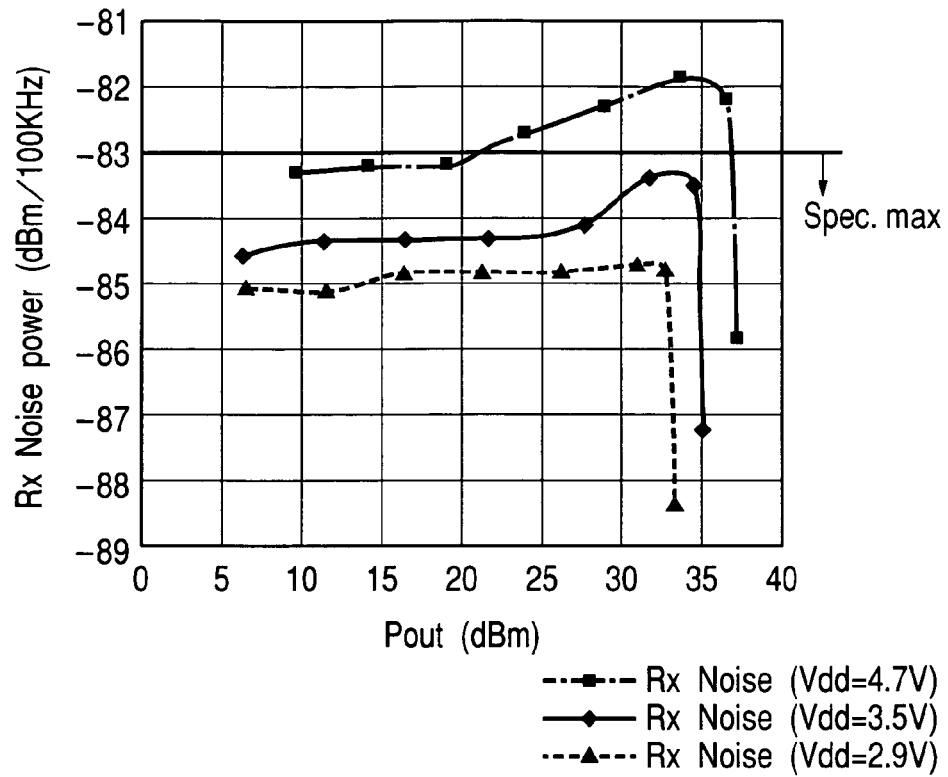
FIG. 7(A) is a graph showing a relationship between the output power Pout and the level of receiving band noise when the mobile phone transmits in the GSM mode.
Figure 7B:
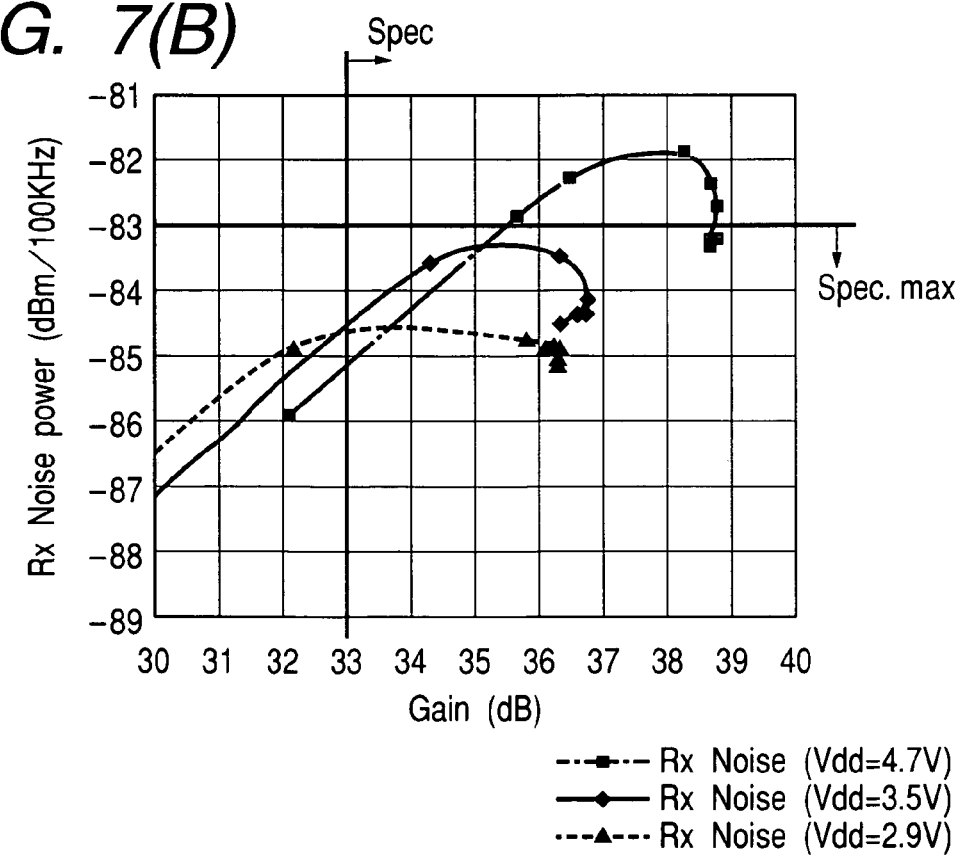
FIG. 7(B) is a graph showing a relationship between the gain of the high-frequency power amplifier circuitry and the level of receiving band noise when the mobile phone transmits in the GSM mode.
Figure 8A:
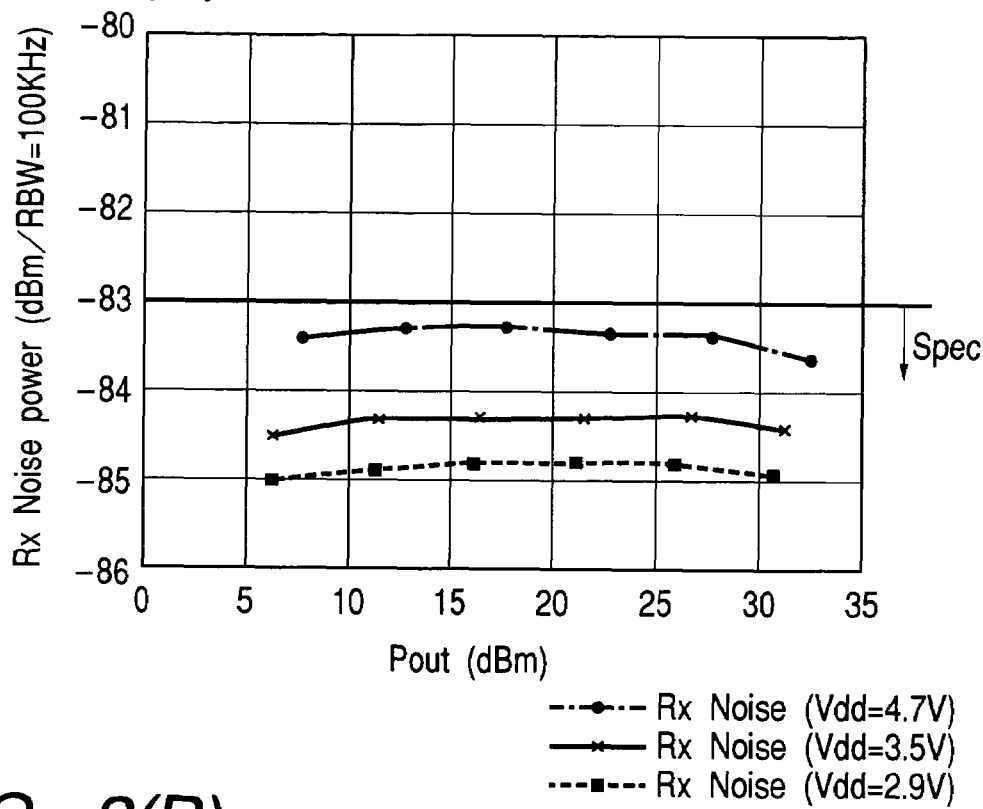
FIG. 8(A) is a graph showing a relationship between the output power Pout and the level of receiving band noise when the mobile phone transmits in the EDGE mode.
Figure 8B:
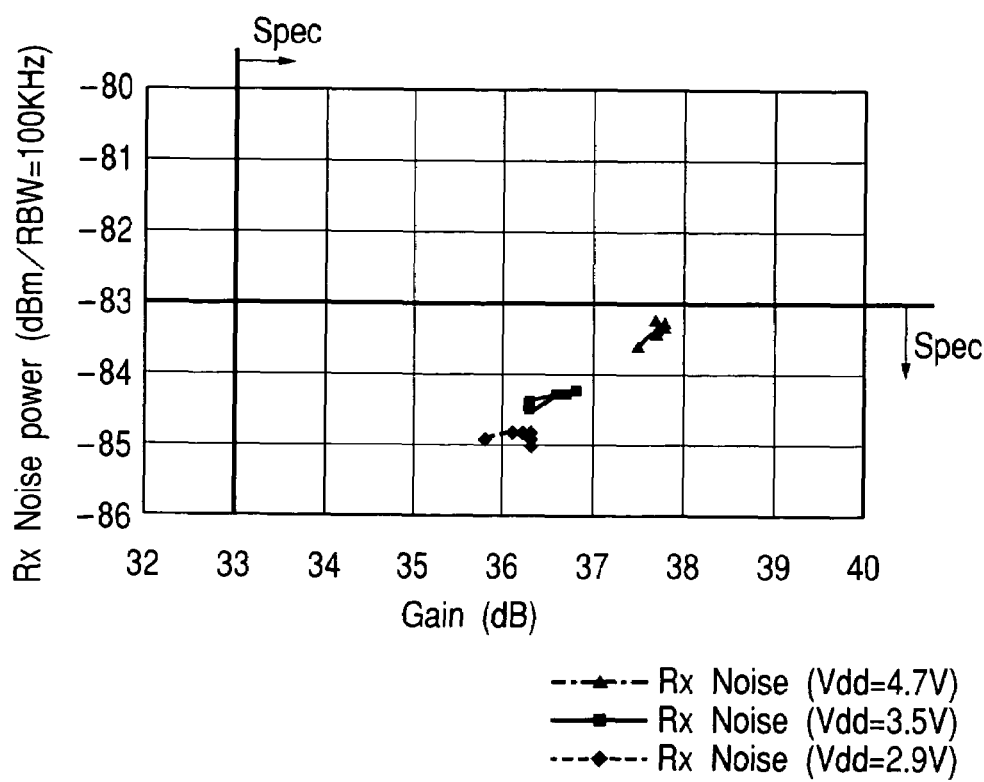
FIG. 8(B) is a graph showing a relationship between the gain of the high-frequency power amplifier circuitry and the level of receiving band noise when the mobile phone transmits in the EDGE mode.

FIG. 6 shows a second embodiment of the present invention. In the above-described embodiment, the mode selection signal Vmode is supplied from the baseband IC 110 to the bias circuit 230 and, by this signal, the switches SW1 and SW2 shown in FIG. 1 make a changeover between two paths to supply the bias current Ibias to the transistor TR1, according to which of the GSM and EDGE modes. Instead, in this second embodiment, the power module 200 includes a comparator circuit 240 which compares the control current Icont2 supplied from the baseband IC 110 with reference current Iref and generates a change-over signal CS for the switches SW1 and SW2

The comparator circuit 240 is configured to, if the control current Icont2 is, for example, 1 mA, actuate the change-over switches SW1 and SW2 in the bias circuit 230, shown in FIG. 2, to make the path to let the control current Icont2 flow into the power supply variation compensation circuit 231 (current combiner circuit 233) and then supply the generated bias current I bias to the transistor TR1. The provision of the comparator circuit 240 in the power module eliminates the need to supply the mode selection signal Vmode from the baseband IC 100 to the bias circuit 230. Consequently, the load of the baseband IC 110 is reduced and the number of external terminals of the RF device 100 and the power module 200 can be reduced.

In this embodiment, the control current Icont2 is not always routed to the power supply variation compensation circuit 231 in the GSM mode. When in the GSM mode and only if the required output power level is high as 35 dBm (Icont2>Iref), it is configured to route the control current Icont2 to the power supply variation compensation circuit 231 and supply the generated bias current I bias to the transistor TR1. With the provision of a plurality of reference currents Iref, it may be configured to route the control current Icont2 to the power supply variation compensation circuit 231 for all required output power levels in the GSM mode and supply the generated bias current Ibias to the transistor TR1.

The reference current Iref is additionally needed in this embodiment, and the power module 200 can be configured to internally generate the reference current Iref, based on the reference voltage Vref which is supplied from the baseband IC 110 to the bias circuit 230. Also, the power module 200 can be configured to internally generate the reference voltage Vref as well.

While the invention made by the present inventors has been described specifically, based on its preferred embodiments, it will be appreciated that the present invention is not limited to the illustrative embodiments described hereinbefore and can be altered, modified, and varied without departing from its spirit or essential characteristics. For example, while the bias circuit 220 which applies gate bias to the first-stage and second-stage FETs in the high-frequency power amplification block 210 generates bias voltages Vb1, Vb2, based on the control current Icont1 supplied from the baseband IC 110 in the above-described embodiment, it can be configured to generate the bias voltages Vb1, Vb2, based on the control current Icont2.

While the output power control signal Vapc output from the APC circuit 340 is supplied to the gain control amplifier 111 in the baseband IC 110 and the gain output level of the gain control amplifier 111 is controlled by the output power control signal Vapc in the above-described embodiment, it may be configured to supply the output power control signal Vapc output from the APC circuit 340 to the bias circuits 220, 230 in the power module 200 so that the bias circuits 220, 230 adjust the bias currents to be supplied to the power amp 210, according to the output power control signal Vapc, thus controlling the gain of the power amp 210.

The foregoing description of the preferred embodiments has been made with regard to the instance where the invention made by the present inventors is primarily applied to the power module included in the radio communication system that is able to transmit and receive in two modulation modes, GMSK modulation and 8-PSK modulation in the background field of application of the invention. However, the present invention is not so limited and is applicable to the power module included in the radio communication system that is able to transmit and receive in two modulation modes, Advanced Mobile Phone Service (AMPS) and Code Division Multiple Access (CDMA) or GSM and W-CDMA (Wideband CDMA) and other combinations.

Advantages that are obtained by typical aspects of the invention disclosed herein can be summarized as follows.

According to the present invention, it can be avoided that receiving band noise becomes so great not to conform to the GSM standards' prescription for such noise in a high voltage region of the power supply voltage, even when the output power is controlled by changing the amplitude of the input signal to the power amplifier circuitry while fixing the bias voltages to be applied to the power amplifying transistors in radio communication system that is able to transmit in two or more modulation modes, e.g., one modulation mode when phase shifts are performed and another modulation mode when phase shifts and amplitude shifts are performed.

In radio communication system such as mobile phones that are able to transmit in two or more modulation modes, the invention also provides an advantage that it can reduce power consumption of the high-frequency power amplifier circuitry (power module) and can lengthen the maximum aggregate call time and idle time that the mobile phone can operate after the battery is fully charged.

What is claimed is:

1. A radio communication system, comprising a high-frequency power amplifier component comprising a high-frequency power amplification circuit which comprises power amplifying transistors and is capable of operating in a first operation mode in which said power amplifying transistors amplify and output phase modulated high-frequency signals and in a second operation mode in which said power amplifying transistors amplify and output phase modulated and amplitude modulated high-frequency signals and a bias circuit which applies bias to said power amplifying transistors, said bias causing a changeover between idle currents flowing across said power amplifying transistors in said first operation mode and idle currents flowing across said power amplifying transistors in said second operation mode, wherein said bias circuit is configured to change the idle currents flowing across said power amplifying transistors, depending on the level of power supply voltage and the level of required output power, in said first operation mode, a second electronic component including a transmission/reception change-over circuit which changes over system operation between transmitting signals and receiving signals, and a third electronic component which modulates transmit signals and inputs modulated transmit signals to said high-frequency power amplifier component, wherein said third electronic component includes a gain control amplifier circuit which is able to control the amplitude of the transmit signals to be supplied to said high-frequency power amplifier component and supplies the signals with amplitude adjusted in accordance with the level of required output power through control of the gain of said gain control amplifier, depending on the level of required output power, to said high-frequency power amplifier component, when in either of said first operation mode and said second operation mode, wherein said third electronic component is configured to supply a signal to indicate which of said first operation mode and said second operation mode to said high-frequency power amplifier component, and wherein said third electronic component includes a storage means for storing table data to determine said control current, depending on the level of required output power, at least in said first operation mode.

2. A radio communication system, comprising the high-frequency power amplifier component comprising a high-frequency power amplification circuit which comprises power amplifying transistors and is capable of operating in a first operation mode in which said power amplifying transistors amplify and output phase modulated high-frequency signals and in a second operation mode in which said power amplifying transistors amplify and output phase modulated and amplitude modulated high-frequency signals and a bias circuit which applies bias to said power amplifying transistors, said bias causing a changeover between idle currents flowing across said power amplifying transistors in said first operation mode and idle currents flowing across said power amplifying transistors in said second operation mode, wherein said bias circuit is configured to change the idle currents flowing across said power amplifying transistors, depending on the level of power supply voltage and the level of required output power, in said first operation mode, a second electronic component including a transmission/reception change-over circuit which changes over system operation between transmitting signals and receiving signals, and a third electronic component which modulates transmit signals and inputs modulated transmit signals to said high-frequency power amplifier component, wherein said third electronic component includes a gain control amplifier circuit which is able to control the amplitude of the transmit signals to be supplied to said high-frequency power amplifier component and supplies the signals with amplitude adjusted in accordance with the level of required output power through control of the gain of said gain control amplifier, depending on the level of required output power, to said high-frequency power amplifier component, when in either of said first operation mode and said second operation mode, wherein said third electronic component is configured to supply a signal to indicate which of said first operation mode and said second operation mode to said high-frequency power amplifier component, wherein said third electronic component includes a storage means for storing table data to determine said control current, depending on the level of required output power, at least in said first operation mode, and wherein the radio communication system further comprises an output power detector circuit which detects the output power of signals output from said high-frequency power amplifier circuit and a power level control circuit which compares a detected power level signal output from the output power detector circuit with a predetermined power level directive signal and generates a control signal to cause said gain control amplifier circuit to change the gain, wherein table data to determine said power level directive signal, depending on the level of required output power, is stored in said storage means.

* * * * *